United States Patent
Grabmaier et al.

(10) Patent No.: US 9,957,158 B2
(45) Date of Patent: May 1, 2018

(54) MICROMECHANICAL PRESSURE SENSOR

(71) Applicant: Robert Bosch GmbH, Stuttgart (DE)

(72) Inventors: Florian Grabmaier, Tuebingen (DE); Eckart Schellkes, Kirchentellinsfurt (DE); Timo Lindemann, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days. days.

(21) Appl. No.: 15/396,867

(22) Filed: Jan. 3, 2017

(65) Prior Publication Data

US 2017/0197824 A1 Jul. 13, 2017

(30) Foreign Application Priority Data

Jan. 13, 2016 (DE) .................. 10 2016 200 263

(51) Int. Cl.
*B81C 1/00* (2006.01)
*B81B 7/00* (2006.01)
*G01L 19/14* (2006.01)

(52) U.S. Cl.
CPC ........ *B81C 1/00333* (2013.01); *B81B 7/0061* (2013.01); *B81C 1/00309* (2013.01); *G01L 19/141* (2013.01); *B81B 2201/0264* (2013.01); *B81B 2207/012* (2013.01); *B81C 2203/0136* (2013.01); *B81C 2203/0154* (2013.01); *B81C 2203/0792* (2013.01)

(58) Field of Classification Search
CPC ........................... G01L 19/141; B81B 7/0061
See application file for complete search history.

(56) References Cited

U.S. PATENT DOCUMENTS

| | | | | |
|---|---|---|---|---|
| 5,859,759 A * | 1/1999 | Moriyama | .......... | G01L 19/0084 338/42 |
| 2001/0042913 A1* | 11/2001 | Fukuda | ................. | H01L 21/565 257/697 |
| 2006/0075815 A1* | 4/2006 | Tanaka | ................. | G01F 1/6845 73/204.26 |
| 2008/0310663 A1* | 12/2008 | Shirasaka | ............ | H04R 19/016 381/355 |
| 2011/0083513 A1* | 4/2011 | Wohlgemuth | ...... | G01L 19/0046 73/716 |

* cited by examiner

*Primary Examiner* — Erik Kielin
(74) *Attorney, Agent, or Firm* — Norton Rose Fulbright US LLP; Gerard Messina

(57) ABSTRACT

A method for producing a pressure sensor comprises providing a substrate with a depression; attaching a micromechanical sensor element to the substrate in the depression; attaching an evaluation circuit to the substrate next to the depression; electrically connecting the evaluation circuit to the sensor element; covering the substrate around the depression by means of a potting die such that the depression is closed; potting the evaluation circuit between the substrate and the potting die; and removing the potting die.

1 Claim, 2 Drawing Sheets

MICROMECHANICAL PRESSURE SENSOR

CROSS REFERENCE

The present application claims the benefit under 35 U.S.C. § 119 of German Patent Application No. DE 102016200263.5 filed on Jan. 13, 2016, which is expressly incorporated herein by reference in its entirety.

FIELD

The present invention relates to a micromechanical pressure sensor. In particular, the present invention relates to the production of the pressure sensor from semiconductor components.

BACKGROUND INFORMATION

A pressure sensor comprises a micromechanical sensor element and an evaluation circuit, which are arranged in a common housing. The housing protects the individual components against environmental influences, such as dust, vibration and heat, and therefore the pressure sensor can be used, for example, on board a motor vehicle. The micromechanical sensor element comprises a membrane, the deformation or deflection of which because of atmospheric pressure is converted into a sensor signal which is then further processed by means of the evaluation Circuit. A plurality of techniques are known for accommodating the sensor element and the evaluation circuit in a housing.

In a first variant, a housing part produced by casting is produced with a depression in which the sensor element and the evaluation circuit are subsequently attached. Electric contacts between said elements then still have to be passivated, which can be complicated and cost-intensive.

In a second variant, the evaluation circuit and optionally other passive components are arranged on a substrate and encapsulated by moulding. A depression in which the micromechanical sensor element is attached in a second placement process is produced at the same time during the casting. However, electric contacts then have to be passivated again, and therefore the process flow comprises two sequential placements. On the other hand, it is advantageous here that, except for the micromechanical sensor, all of the components are enclosed in the potting compound and are therefore readily protected against environmental influences. The potting compound can provide better protection than a subsequently applied passivation material, such as, for example, a silicone gel.

In a third variant, the sensor element is placed together with the evaluation circuit on the substrate and made contact with before the pressure sensor is potted with a potting compound. For this purpose, a film customarily has to be inserted between a potting die and the substrate in order to ensure tightness in relation to the potting compound. As a result, one placement process is sufficient, and the sensor element remains accessible from the outside even in the finished state of the sensor. It is disadvantageous in this connection that the potting die has to be sealed off from the membrane of the sensor element. In the process, the membrane may easily be damaged or the tightness in relation to the potting compound cannot be ensured. Overflowing potting compound (mould) can soil individual components, such as the pressure sensor and, in particular, the membrane thereof (mould flash). If the membrane comes into contact with potting compound, the sensor signal may be falsified as a result.

SUMMARY

It is an object of the present invention to specify an improved technique for providing a pressure sensor which overcomes at least one of the abovementioned disadvantages. The present invention achieves this object by means of the embodiments described herein.

A method for producing a pressure sensor comprises steps of providing a substrate with a depression; of attaching a micromechanical sensor element to the substrate in the depression; of attaching an evaluation circuit to the substrate next to the depression; of electrically connecting the evaluation circuit to the sensor element; of covering the substrate around the depression by means of a potting die such that the depression is closed; of potting the evaluation circuit between the substrate and the potting die; and of removing the potting die.

The method makes it possible to produce the pressure sensor by means of only a single placement process in which both the sensor element and the evaluation circuit are attached to the substrate. During the potting of the evaluation circuit, the depression in which the sensor element is situated is sealed off by means of the potting die. Entry of potting compound can thus be reliably prevented. There is a sealing surface here between the potting die and the substrate, and therefore tightness does not have to be produced in relation to the sensor element and in particular a membrane of the sensor element. Contamination or overloading of the sensor and its membrane can thus be prevented.

A potting die for producing the above-described pressure sensor is configured in order to fit closely to the substrate around the depression and to leave free a predetermined region around and above the evaluation circuit. The region can then be filled with the potting compound in order to pot the evaluation circuit on the substrate. At the same time, penetration of potting compound into the depression in which the sensor element is situated can be reliably prevented by means of the potting die.

A pressure sensor which can be produced in particular by the above-described method and, for example, using the likewise above-described potting die comprises a substrate with a depression, a micromechanical sensor element which is attached to the substrate in the depression, an evaluation circuit which is attached to the substrate next to the depression, an electrical connection of the evaluation circuit to the sensor element, and a potting compound which covers the evaluation circuit and leaves the sensor element free.

The sensor element can be readily protected by the potting compound, and therefore it can be suitable in particular for applications in the automotive sector. For example, the sensor element can be used on board a motor vehicle, for example in conjunction with an exhaust tract of an internal combustion engine.

BRIEF DESCRIPTION OF THE DRAWINGS

The present invention is described in more detail with reference to the figures.

DETAILED DESCRIPTION OF EXAMPLE EMBODIMENTS

Figure 1:
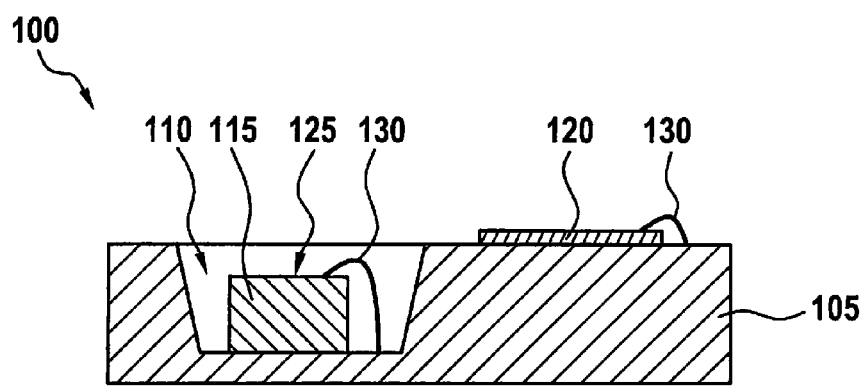
FIGS. 1-4 illustrate method steps during the production of a pressure sensor.
Figure 2:
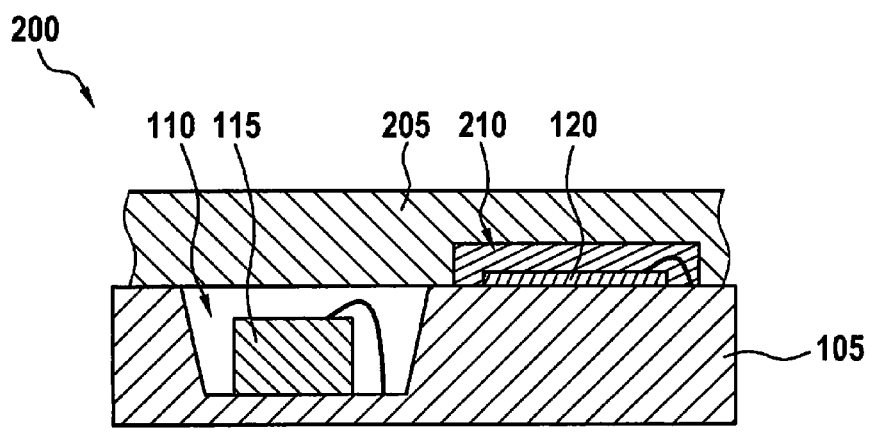
Figure 3:
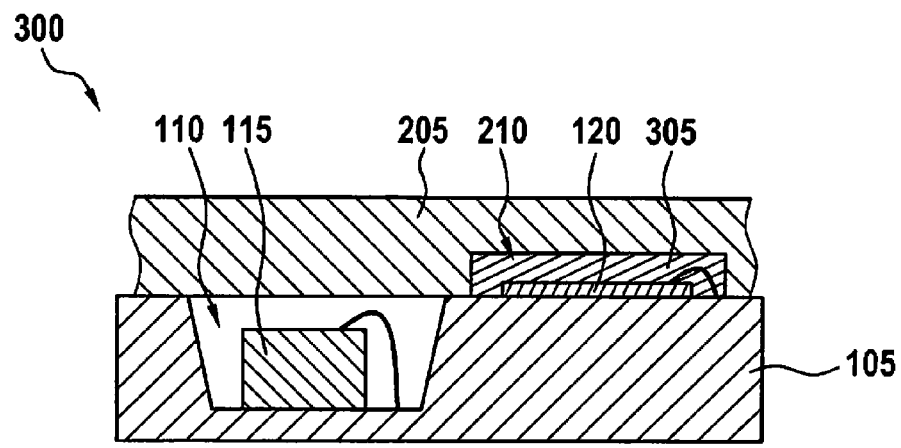

FIG. 1 shows a first step 100 of a method for producing a pressure sensor. A substrate 105 comprises a depression 110 which may also be called a cavity. The substrate 105 customarily comprises a semiconductor material, for example silicon. On an upper surface of the substrate 105, a micromechanical sensor element 115 is attached in the depression 110 and an evaluation circuit 120 is attached next to the depression 110. The micromechanical sensor element 115 comprises a micromechanical structure (MEMS: Micro-electromechanical System) which comprises a membrane 125 which is mounted movably in relation to the rest of the sensor element 115. The evaluation circuit 120 is customarily a semiconductor circuit which is generally designed as an application-specific integrated circuit (ASIC). The sensor element 115 and the evaluation circuit 120 are customarily fastened to the membrane 125 with an adhesive bonding technique.

Electrical connections between the sensor element 115 and the evaluation circuit 120 are customarily produced via bonding wires 130 which preferably lead in each case to a conductive structure within or on the surface of the substrate 105. This operation is also referred to as contact connection, bonding or connecting electrically. An external terminal for the contact connection of the pressure sensor is not illustrated in FIG. 1.

In a step 200, the substrate 105, the sensor element 115 and the evaluation circuit 120 are covered by means of a potting die 205. A region 210 around the evaluation circuit 120 and thereabove is left free here by the potting die 205. However, the potting die 205 provides as tight a seal as possible from the substrate 105 outside this region. In addition, the potting die 205 is formed in such a manner that it fits closely to the substrate 105 around the depression 110. A sealing surface between the substrate 105 and the potting die 205 can have a predetermined minimum width in a manner encircling the depression 110. It is not envisaged to provide a film or another temporary or permanent sealing element between the potting die 205 and the substrate 105. On the contrary, it is preferred for the potting die 205 to fit directly to the substrate 105 at the described points.

In a third step 300, the region 210 between the potting die 205 and the substrate 105 is filled by means of a potting compound 305. Corresponding channels for guiding the potting compound 305 can be formed in the potting die 205. The potting compound 305 is customarily flowable under elevated temperature and optionally under elevated pressure in order to fill the region 210. The potting compound 305 customarily flows in the horizontal direction along the surface of the substrate 105, but cannot penetrate the region of the depression 110 since the potting die 205 forms an insurmountable barrier with the substrate 105.

Figure 4:
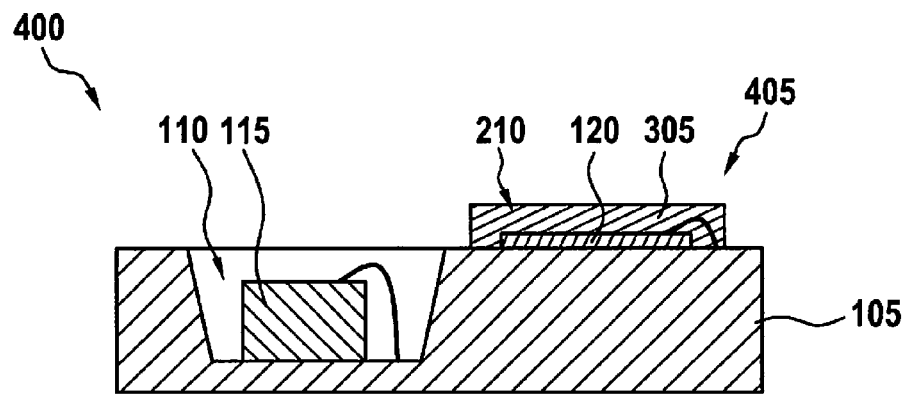

FIG. 4 shows a fourth step 400 in which the potting die 205 is removed again in the region 210 after the cooling, crosslinking or setting of the potting compound 305. As a result, a pressure sensor 405 is produced, the evaluation circuit 120 of which is covered by means of potting compound 305 and is therefore passivated, whereas its micromechanical sensor element 115 continues to be freely accessible. The pressure sensor 405 can be used in particular for determining a pressure or a difference in pressure between gases, for example on board a motor vehicle.

What is claimed is:

1. A method for producing a pressure sensor, comprising:
providing a substrate with a depression;
attaching a micromechanical sensor element to the substrate in the depression;
attaching to the substrate an evaluation circuit next to the depression;
electrically connecting the evaluation circuit to the sensor element;
covering the substrate around the depression using a potting die such that the depression is closed, the potting die having a sealing surface, the sealing surface directly contacting the substrate in a manner so as to completely encircle the depression;
potting the evaluation circuit between the substrate and the potting die using a potting compound, the sealing surface of the potting die sealing the depression from the potting compound without use of any further sealing element between the potting die and the substrate; and
removing the potting die.

* * * * *